United States Patent
Yabu et al.

(10) Patent No.: US 11,553,583 B2
(45) Date of Patent: Jan. 10, 2023

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Takayuki Yabu, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/468,395

(22) Filed: Sep. 7, 2021

(65) Prior Publication Data

US 2022/0110205 A1    Apr. 7, 2022

(30) Foreign Application Priority Data

Oct. 1, 2020  (JP) .............................. JP2020-166727

(51) Int. Cl.
*G03F 7/20* (2006.01)
*H05G 2/00* (2006.01)
*G21K 1/06* (2006.01)

(52) U.S. Cl.
CPC ......... *H05G 2/008* (2013.01); *G03F 7/70025* (2013.01); *G03F 7/70033* (2013.01); *G03F 7/70041* (2013.01); *G03F 7/70608* (2013.01); *G21K 1/06* (2013.01); *H05G 2/006* (2013.01)

(58) Field of Classification Search
CPC .... H05G 2/008; H05G 2/006; G03F 7/70025; G03F 7/70033; G03F 7/70041; G03F 7/70608; G21K 1/06
See application file for complete search history.

(56) References Cited

U.S. PATENT DOCUMENTS

| 2008/0087847 A1* | 4/2008 | Bykanov ............. G03F 7/70033 |
| | | 250/504 R |
| 2008/0143989 A1 | 6/2008 | Brudermann et al. |
| 2013/0022901 A1 | 1/2013 | Buurman et al. |
| 2014/0233005 A1 | 8/2014 | Crouch et al. |
| 2019/0277772 A1* | 9/2019 | Nishizawa ............. G01N 21/93 |

FOREIGN PATENT DOCUMENTS

JP    2015509646 A  *  3/2015

OTHER PUBLICATIONS

Dutch Search Report and Written Opinion mailed by the Netherlands Patent Office dated Jun. 1, 2022, which corresponds to Dutch Patent Application No. 2029171 and is related to U.S. Appl. No. 17/468,395.

* cited by examiner

*Primary Examiner* — Mesfin T Asfaw
(74) *Attorney, Agent, or Firm* — Studebaker & Brackett PC

(57) ABSTRACT

An extreme ultraviolet light generation system may include a laser device configured to emit pulse laser light, an EUV light concentrating mirror configured to reflect and concentrate extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed.

18 Claims, 14 Drawing Sheets

EXTREME ULTRAVIOLET LIGHT GENERATION SYSTEM AND ELECTRONIC DEVICE MANUFACTURING METHOD

CROSS-REFERENCE TO RELATED APPLICATIONS

The present application claims the benefit of Japanese Patent Application No. 2020-166727, filed on Oct. 1, 2020, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, fine processing at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: US Patent Application Publication No. 2008/0143989

SUMMARY

An extreme ultraviolet light generation system according to an aspect of the present disclosure includes a laser device configured to emit pulse laser light, an EUV light concentrating mirror configured to reflect and concentrate extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed.

An electronic device manufacturing method according to an aspect of the present disclosure includes generating extreme laser light in an extreme ultraviolet light generation system, emitting the extreme ultraviolet light to an exposure apparatus, and exposing a photosensitive substrate to the extreme ultraviolet light in the exposure apparatus to manufacture an electronic device. Here, the extreme ultraviolet light generation system include a laser device configured to emit pulse laser light, an EUV light concentrating mirror configured to reflect and concentrate the extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed.

A method of manufacturing an electronic device according to an aspect of the present disclosure includes inspecting a defect of a mask by irradiating the mask with extreme ultraviolet light generated in an extreme ultraviolet light generation system, selecting a mask using a result of the inspection, and exposing and transferring a pattern formed on the selected mask onto a photosensitive substrate. Here, the extreme ultraviolet light generation system includes a laser device configured to emit pulse laser light, an EUV light concentrating mirror configured to reflect and concentrate the extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed.

BRIEF DESCRIPTION OF THE DRAWINGS

Embodiments of the present disclosure will be described below merely as examples with reference to the accompanying drawings.

DESCRIPTION OF EMBODIMENTS

Figure 1:
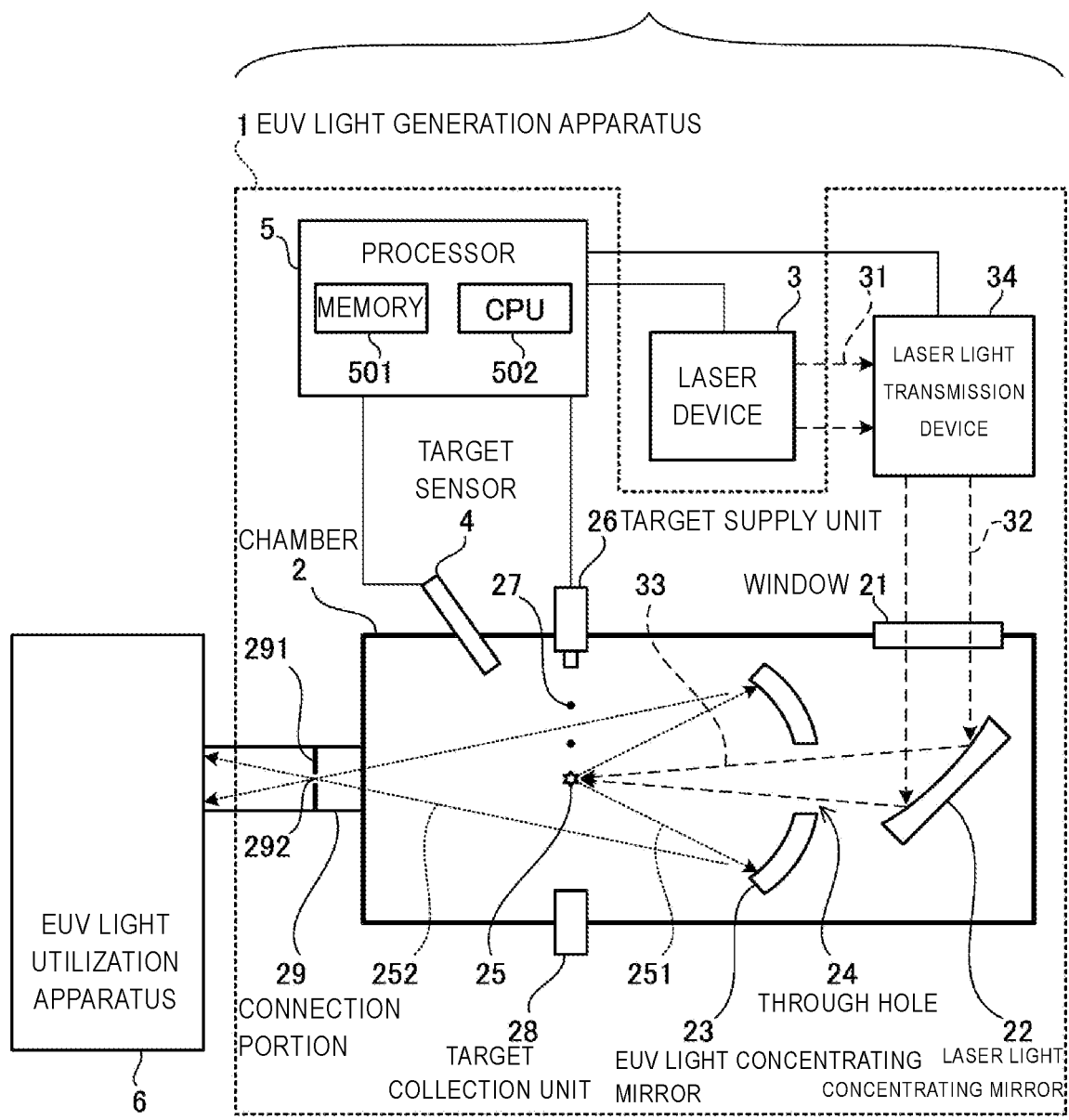
FIG. 1 schematically shows the configuration of an LPP-type EUV light generation system according to a comparative example.

<Contents>
1. EUV light generation system 11 according to comparative example
   1.1 Configuration
   1.2 Operation
   1.3 Problems of comparative example
2. EUV light generation system 11a that controls irradiation frequency $F_I$ to suppress change in second energy parameter $P_2$
   2.1 Configuration
   2.2 Operation
      2.2.1 First operation example for increasing irradiation frequency $F_I$
      2.2.2 Second operation example for increasing irradiation frequency $F_I$
   2.3 Effect
3. EUV light generation system 11a to stepwise increase irradiation frequency $F_I$
   3.1 Configuration and operation
   3.2 Effect
4. EUV light generation system 11a for changing pulse energy E of pulse laser light 33
   4.1 Configuration and operation
   4.2 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. EUV Light Generation System 11 According to Comparative Example 1.1 Configuration FIG. 1 schematically shows the configuration of an LPP-type EUV light generation system 11 according to a comparative example. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a target supply unit 26. The chamber 2 is a sealable container. The target supply unit 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulse laser light 32 emitted from the laser device 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between the internal space of the chamber 2 and the internal space of an EUV light utilization apparatus 6. An example of the EUV light utilization apparatus 6 will be described later with reference to FIGS. 15 and 16. A wall 291 in which an aperture is formed is arranged in the connection portion 29. The wall 291 is arranged such that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 emitted from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 supplies the target 27 containing the target substance to the plasma generation region 25 in the chamber 2. The target 27 is irradiated with the pulse laser light 33. The target 27 irradiated with the pulse laser light 33 is turned into plasma, and radiation light 251 is radiated from the plasma. EUV light contained in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. When the target 27 includes a plurality of droplets, one droplet may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls the timing at which the target 27 is output, the output direction of the target 27, and the like. Further, the processor 5 controls oscillation timing of the laser device 3, a travel direction of the pulse laser light 32, the concentration position of the pulse laser light 33, and the like. Such various kinds of control described above are merely exemplary, and other control may be added as necessary.

1.3 Problems of Comparative Example

Figure 2:
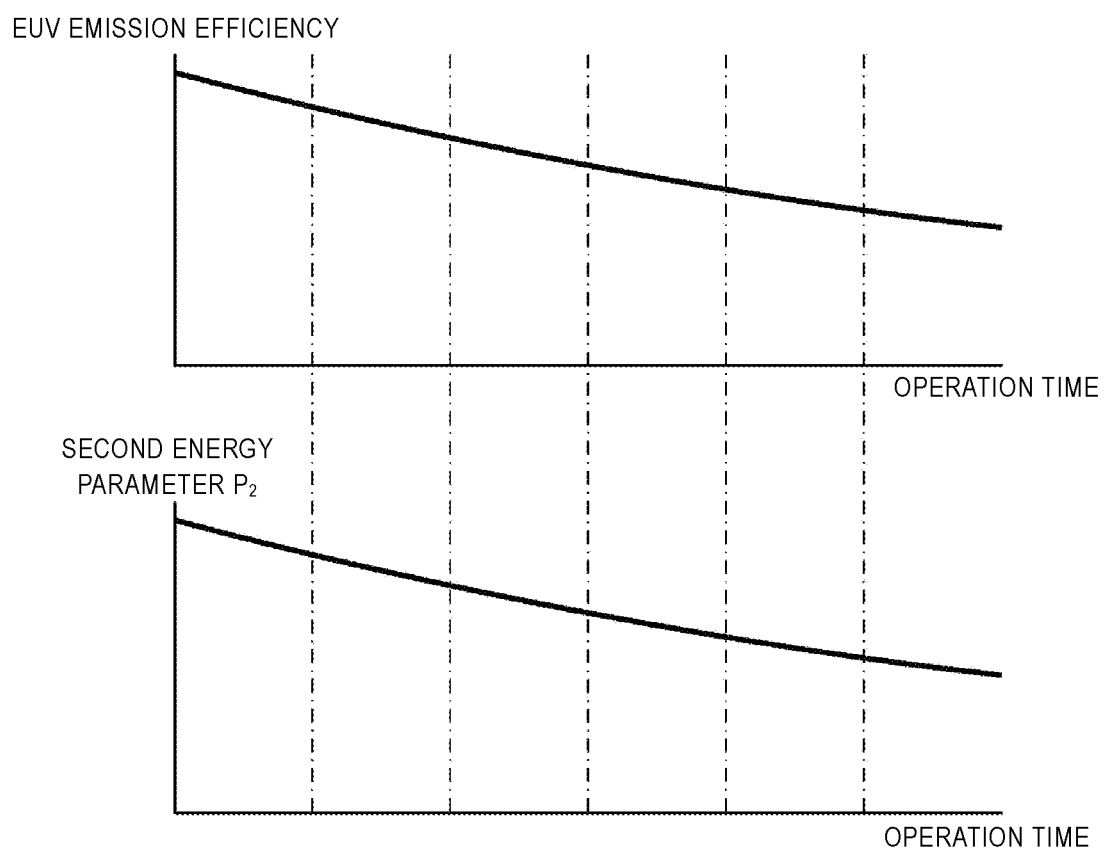
FIG. 2 is a graph showing change in an EUV emission efficiency and a second energy parameter in the comparative example.

FIG. 2 is a graph showing change in an EUV emission efficiency and a second energy parameter $P_2$ in the comparative example. In the graph of the present disclosure, the horizontal axis represents the operation time, and the alternate long and short dash lines indicate that events on each alternate long and short dash line occur at the same timing.

The second energy parameter $P_2$ is a parameter related to the energy per unit time of the EUV light reflected by the EUV light concentrating mirror 23 and includes one of EUV power, EUV power density, and EUV radiation brightness. The EUV power is the energy per unit time at the focal point of the EUV light, and the unit is watts (W). The focal point is the intermediate focal point 292 or a focal point on the downstream side on the optical path of the EUV light from the intermediate focal point 292. The EUV power density is a value obtained by dividing the EUV power by the optical path cross section at the focal point of the EUV light, and the unit is W/mm². The EUV radiation brightness is a value obtained by dividing the EUV power density by a solid angle formed before and after the focal point of the EUV light, and the unit is W/mm²sr. A first energy parameter $P_1$ will be described later.

When the EUV light is generated by the EUV light generation system 11, the EUV emission efficiency may gradually decrease due to deterioration of the EUV collector mirror 23 or the like. When the EUV emission efficiency decreases, the second energy parameter $P_2$ decreases even when various conditions such as the pulse energy E of the pulse laser light 33 are the same. The EUV light having a low second energy parameter $P_2$ may not be suitable for use in the EUV light utilization apparatus 6.

As one solution, the EUV light generation system 11 may be designed to output the EUV light having a second energy parameter $P_2$ significantly higher than the lower limit of the second energy parameter $P_2$ required by the EUV light utilization apparatus 6 when the EUV light generation system 11 is new. Accordingly, the EUV light having the second energy parameter $P_2$ higher than the lower limit can be obtained for a long period of time. However, when it is new, the second energy parameter $P_2$ may be too high.

In some examples of the present disclosure, an irradiation frequency $F_I$ of the pulse laser light 33 with which the target 27 is irradiated is controlled so as to suppress change in the second energy parameter $P_2$. The irradiation frequency $F_I$ refers to the number per second of times the target 27 is irradiated with the pulse laser light 33 and turned into plasma.

Figure 3:
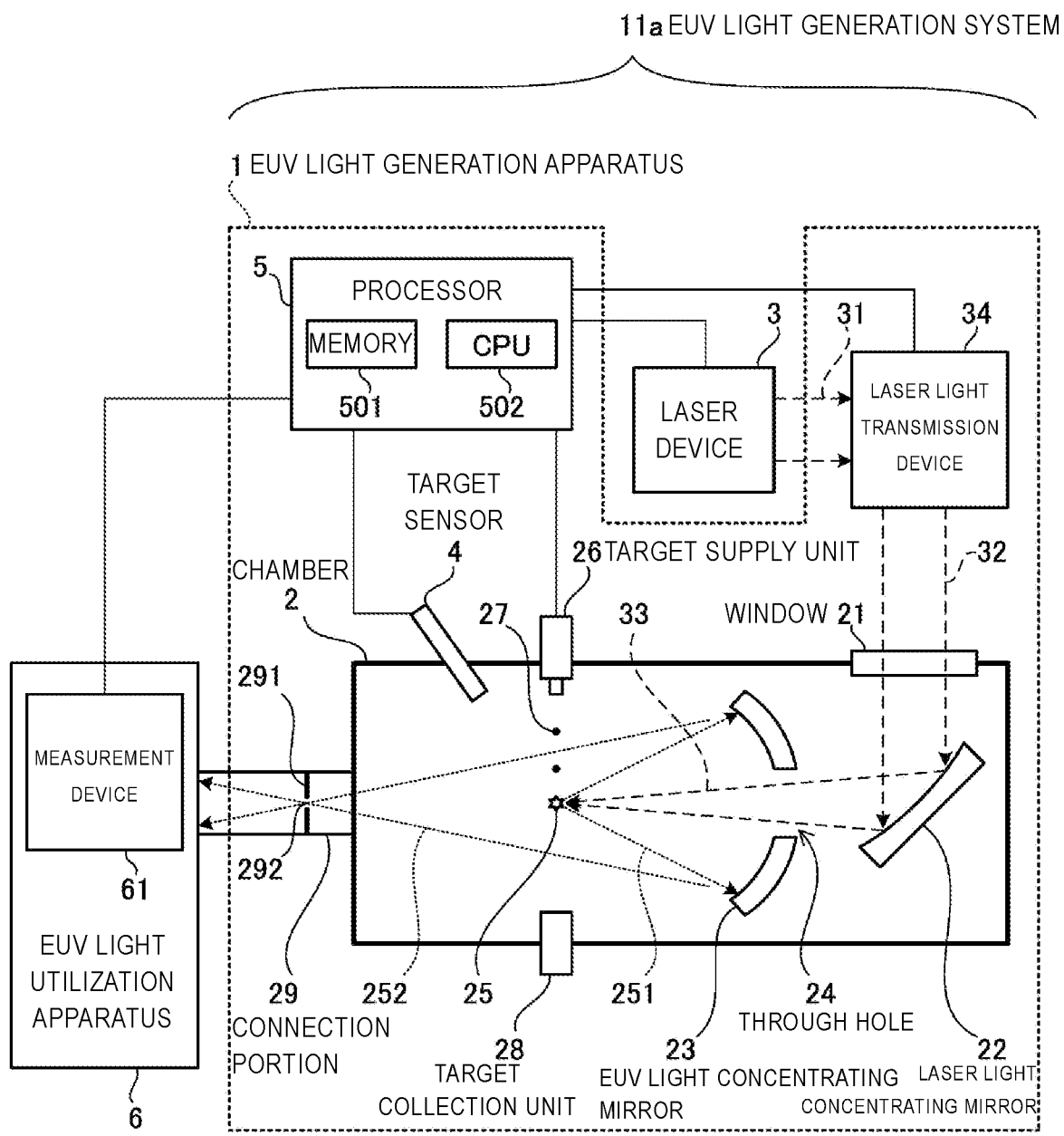
FIG. 3 schematically shows the configuration of an EUV light generation system according to a first embodiment.

2. EUV Light Generation System 11a that Controls Irradiation Frequency $F_I$ to Suppress Change in Second Energy Parameter $P_2$ 2.1 Configuration FIG. 3 schematically shows the configuration of an EUV light generation system 11a according to a first embodiment. The EUV light utilization apparatus 6 that receives the EUV light generated in the EUV light generation system 11a includes a measurement device 61. The processor 5 included in the EUV light generation system 11a is connected to the measurement device 61 by a signal line through a processor (not shown) of the EUV light utilization apparatus 6.

The present disclosure is not limited to the case where the measurement device 61 is arranged in the EUV light utilization apparatus 6. The measurement device 61 may be arranged in the chamber 2.

The measurement device 61 measures the first energy parameter $P_1$ of the EUV light. The first energy parameter $P_1$ includes one of EUV pulse energy, EUV power, EUV power density, and EUV radiation brightness. The EUV pulse energy is the energy per pulse of the EUV light at the intermediate focal point 292, and the unit is joule (J).

The first energy parameter $P_1$ may include a combination of one of the EUV pulse energy and the EUV power and one of EUV light concentration size and EUV emission size. The EUV light concentration size is a spot diameter when the EUV light is concentrated at the focal point. The EUV emission size is a plasma diameter in the plasma generation region 25. The EUV light concentration size can be calculated based on the EUV emission size. The light concentration size at the intermediate focal point 292 can be calculated based on the EUV light concentration size. The EUV power can be calculated based on the EUV pulse energy. The EUV power density and the EUV radiation brightness can be calculated based on the combination of the EUV light concentration size and the EUV power.

The processor 5 receives the first energy parameter $P_1$ from the EUV light utilization apparatus 6. The processor 5 calculates the second energy parameter $P_2$ based on the first energy parameter $P_1$.

As the first energy parameter $P_1$, one of the EUV power, the EUV power density, and the EUV radiation brightness may be measured by the measurement device 61 and received by the processor 5. In this case, since the second energy parameter $P_2$ is received as the first energy parameter $P_1$, the processor 5 may not calculate the second energy parameter $P_2$.

2.2 Operation

Figure 4:
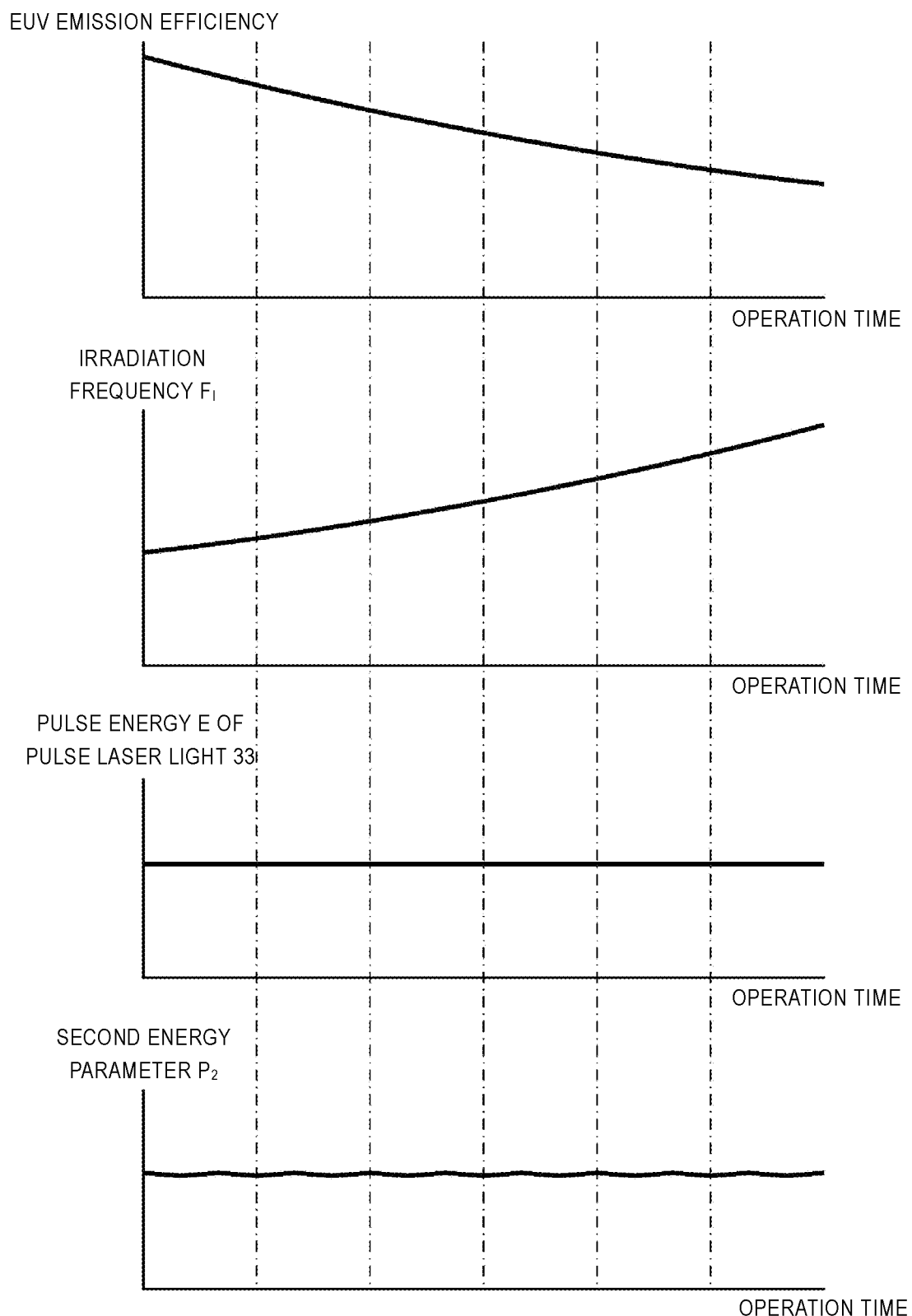
FIG. 4 is a graph showing decrease in the EUV emission efficiency in the first embodiment, control of an irradiation frequency and pulse energy of pulse laser light in accordance with the decrease, and change in the second energy parameter.

FIG. 4 is a graph showing decrease in the EUV emission efficiency in the first embodiment, control of the irradiation frequency $F_I$ and the pulse energy E of the pulse laser light 33 in accordance with the decrease, and change in the second energy parameter $P_2$.

In contrast to the comparative example in which the second energy parameter $P_2$ decreases as the EUV emission efficiency decreases, in the first embodiment, the irradiation frequency $F_I$ of the pulse laser light 33 with which the target 27 is irradiated is controlled so that the change in the second energy parameter $P_2$ is suppressed. That is, in the first embodiment, the irradiation frequency $F_I$ is controlled so that the irradiation frequency $F_I$ increases as the EUV emission efficiency decreases. The pulse energy E of the pulse laser light 33 may not be changed.

When the EUV emission efficiency decreases, the EUV pulse energy decreases. However, by increasing the irradiation frequency $F_I$ instead, the change in the second energy parameter $P_2$ can be suppressed.

2.2.1 First Operation Example for Increasing Irradiation Frequency $F_I$

Figure 5:
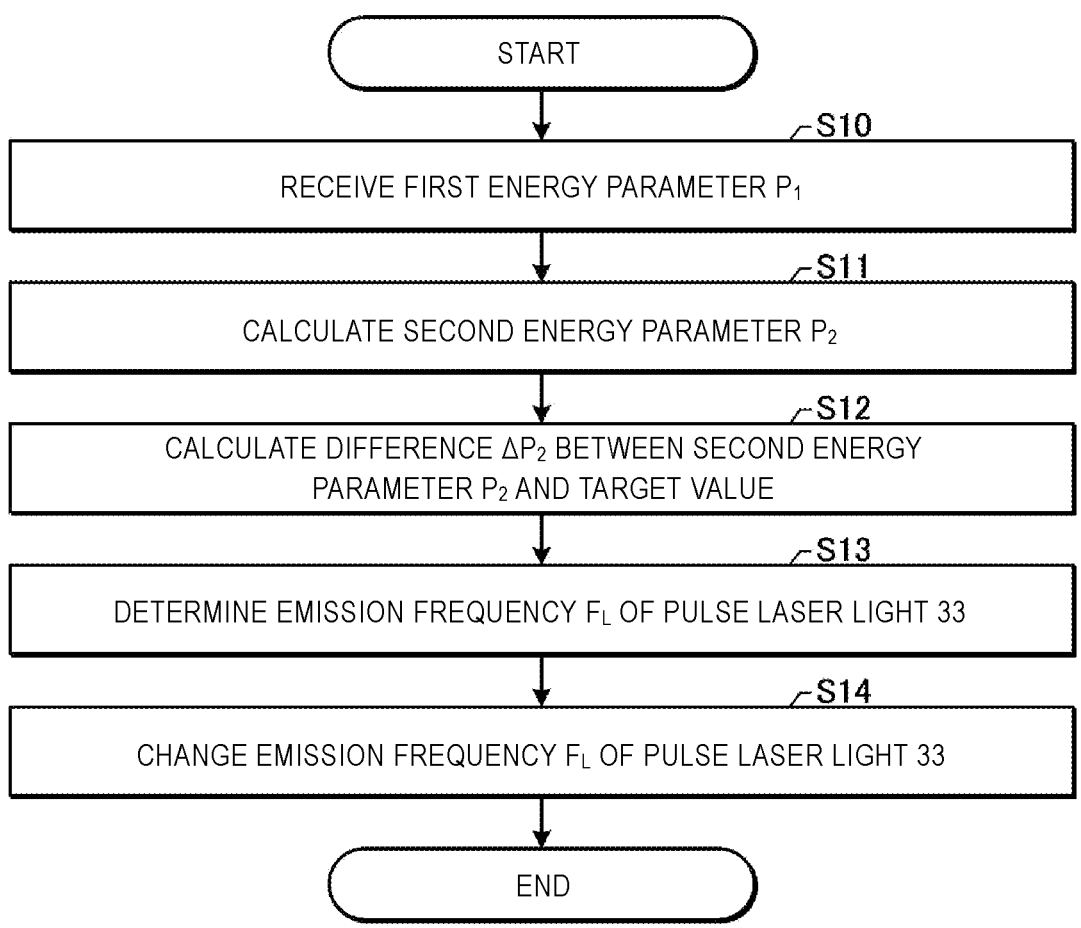
FIG. 5 is a flowchart showing a first operation example for increasing the irradiation frequency in the first embodiment.
Figure 6:
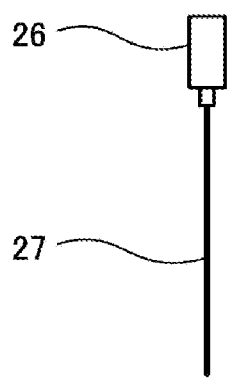
FIG. 6 shows the shape of a target when a target supply unit generates and supplies a jet-shaped target to an optical path of the pulse laser light in the first embodiment.

FIG. 5 is a flowchart showing a first operation example for increasing the irradiation frequency $F_I$ in the first embodiment. FIG. 6 shows the shape of the target 27 when the target supply unit 26 generates and supplies a jet-shaped target 27 to the optical path of the pulse laser light 33 in the first embodiment. The processing shown in FIG. 5 is suitable for the case where the target supply unit 26 generates the jet-shaped target 27.

In S10 of FIG. 5, the processor 5 receives the first energy parameter $P_1$ measured by the measurement device 61 from the EUV light utilization apparatus 6.

In S11, the processor 5 calculates the second energy parameter $P_2$ based on the first energy parameter $P_1$.

In S12, the processor 5 calculates the difference $\Delta P_2$ between the second energy parameter $P_2$ and the target value.

In S13, the processor 5 determines the emission frequency $F_L$ of the pulse laser light 33. For example, when the second energy parameter $P_2$ is lower than the target value, an emission frequency $F_L$ of the pulse laser light 33 is increased in accordance with the difference $\Delta P_2$ from the target value. The emission frequency $F_L$ may be controlled by proportional-integral-differential (PID) control.

The emission frequency $F_L$ refers to the number per second of pulses of the pulse laser light 33 output from the laser device 3. By increasing the emission frequency $F_L$ of the pulse laser light 33, the irradiation frequency $F_I$ of the pulse laser light 33 with which the target 27 is irradiated increases. When all pulses of the pulse laser light 33 are radiated to the target 27 and a part of the target 27 is turned into plasma for each pulse, the emission frequency $F_L$ and the irradiation frequency $F_I$ are the same.

In S14, the processor 5 changes the emission frequency $F_L$ of the pulse laser light 33 to the value determined in S13.

After S14, the processor 5 ends the processing of the flowchart. The processing of the flowchart is repeated each time the operation time of the EUV light generation system 11a or the number of output pulses of the EUV light reaches a predetermined value.

2.2.2 Second Operation Example for Increasing Irradiation Frequency $F_I$

Figure 7:
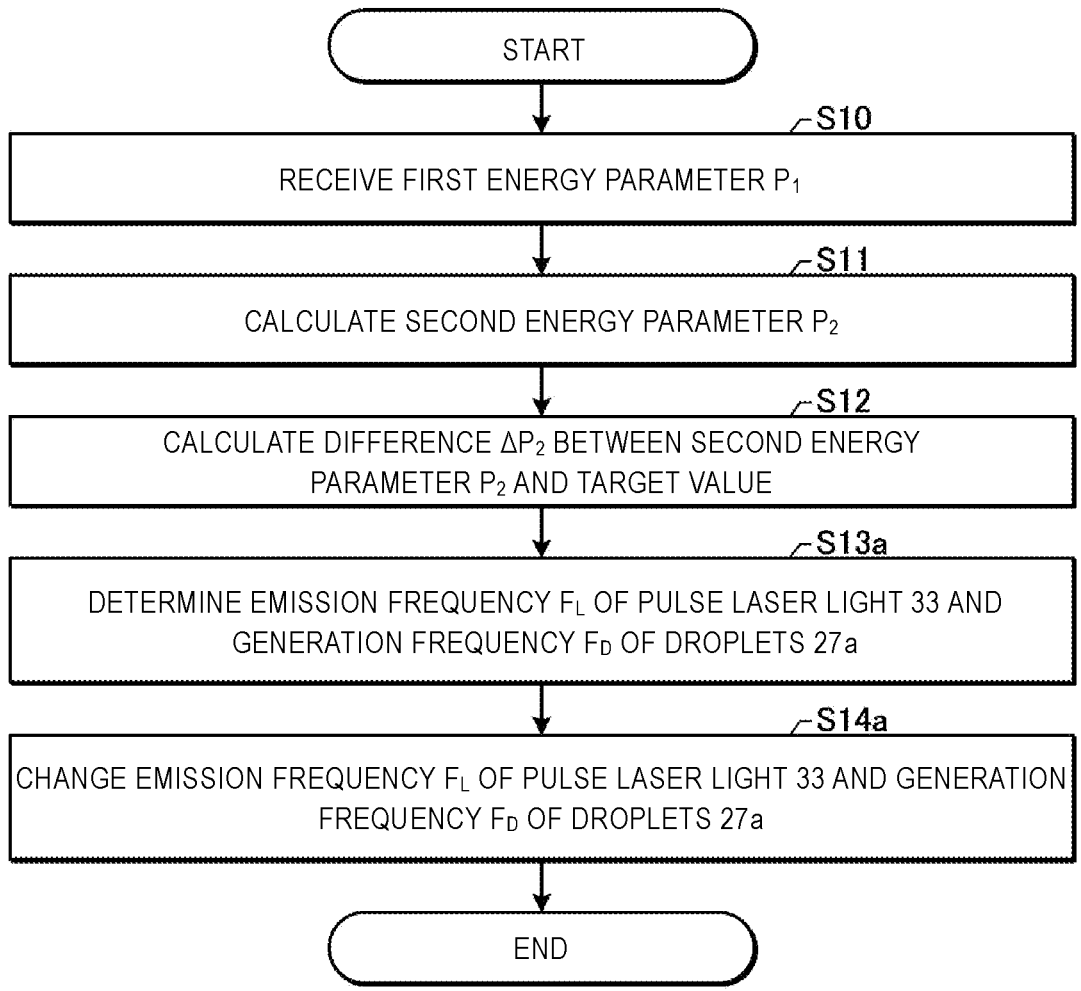
FIG. 7 is a flowchart showing a second operation example for increasing the irradiation frequency in the first embodiment.
Figure 8:
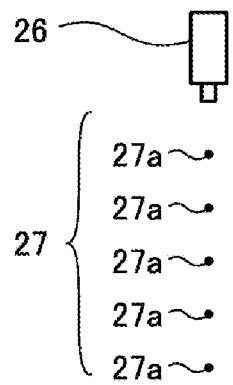
FIG. 8 shows an arrangement of droplets when the target supply unit sequentially generates and supplies a plurality of droplets as the target to the optical path of the pulse laser light in the first embodiment.

FIG. 7 is a flowchart showing a second operation example for increasing the irradiation frequency $F_I$ in the first embodiment. FIG. 8 shows an arrangement of droplets 27a when the target supply unit 26 sequentially generates and supplies a plurality of the droplets 27a as the target 27 to the optical path of the pulse laser light 33 in the first embodiment. The processing shown in FIG. 7 is suitable for the case where the target supply unit 26 sequentially generates the droplet 27a.

The processes of S10 to S12 in FIG. 7 are similar to those described with reference to FIG. 5.

After S12, in S13a, the processor 5 determines both the emission frequency $F_L$ of the pulse laser light 33 and a generation frequency $F_D$ of the droplets 27a. The generation frequency $F_D$ refers to the number per second of the droplets 27a generated by the target supply unit 26. When the second energy parameter $P_2$ is lower than the target value, both the emission frequency $F_L$ of the pulse laser light 33 and the generation frequency $F_D$ of the droplets 27a are increased in accordance with the difference $\Delta P_2$ from the target value. By increasing both the emission frequency $F_L$ of the pulse laser light 33 and the generation frequency $F_D$ of the droplets 27a, the irradiation frequency $F_I$ of the pulse laser light 33 with which the target 27 is irradiated increases.

In S14a, the processor 5 changes both the emission frequency $F_L$ of the pulse laser light 33 and the generation frequency $F_D$ of the droplets 27a to the values determined in S13a.

After S14a, the processor 5 ends the processing of the flowchart. The processing of the flowchart is repeated each time the operation time of the EUV light generation system 11a or the number of output pulses of the EUV light reaches a predetermined value.

2.3 Effect (1) According to the first embodiment, the EUV light generation system 11a includes the laser device 3, the EUV light concentrating mirror 23, and the processor 5. The laser device 3 emits the pulse laser light 33. The EUV light concentrating mirror 23 reflects and concentrates the EUV light generated by irradiating the target 27 with the pulse laser light 33. The processor 5 receives the first energy parameter $P_1$ of the EUV light and controls the irradiation frequency $F_I$ of the pulse laser light 33 with which the target 27 is irradiated so that the change in the second energy parameter $P_2$ related to the energy per unit time of the EUV light reflected by EUV light concentrating mirror 23 is suppressed.

Accordingly, by controlling the irradiation frequency $F_I$, it is possible to suppress the second energy parameter $P_2$ from decreasing. Further, when the irradiation frequency $F_I$ is decreased, the number of times of generation of plasma is reduced, so that deterioration of the EUV light concentrating mirror 23 can be delayed and the life of the EUV light concentrating mirror 23 can be improved.

(2) According to the first embodiment, the first energy parameter $P_1$ includes one of the EUV pulse energy, the EUV power, the EUV power density, and the EUV radiation brightness, and the second energy parameter $P_2$ includes one of the EUV power, the EUV power density, and the EUV radiation brightness.

Accordingly, the EUV power can be calculated as the second energy parameter $P_2$ based on the EUV pulse energy. Alternatively, one of the EUV power, the EUV power density, and the EUV radiation brightness can be used as the second energy parameter $P_2$. By stabilizing the second energy parameter $P_2$, it is possible to maintain preferable EUV light characteristics for the EUV light utilization apparatus 6.

(3) According to the first embodiment, the first energy parameter $P_1$ includes the combination of one of the EUV pulse energy and the EUV power and one of the EUV light concentration size and the EUV emission size, and the second energy parameter $P_2$ includes one of the EUV power, the EUV power density, and the EUV radiation brightness.

Based on the combinations, the EUV power density or the EUV radiation brightness can be calculated as the second energy parameter $P_2$. By stabilizing the second energy parameter $P_2$, it is possible to maintain preferable EUV light characteristics for the EUV light utilization apparatus 6.

(4) According to the first embodiment, the processor 5 is connected to the EUV light utilization apparatus 6 that receives the EUV light generated in the EUV light generation system 11a, and receives the first energy parameter $P_1$ from the EUV light utilization apparatus 6.

Accordingly, it is possible to suppress the change in the second energy parameter $P_2$ without arranging the measurement device of the first energy parameter $P_1$ in the EUV light generation system 11a.

(5) According to the first embodiment, the processor 5 calculates the second energy parameter $P_2$ based on the first energy parameter $P_1$.

Accordingly, even without directly measuring the second energy parameter $P_2$, the second energy parameter $P_2$ is calculated based on the first energy parameter $P_1$, and the change in the second energy parameter $P_2$ can be suppressed.

(6) According to the first embodiment, the processor 5 receives the second energy parameter $P_2$ as the first energy parameter $P_1$.

Accordingly, even without calculating the second energy parameter $P_2$, the change in the second energy parameter $P_2$ can be suppressed.

(7) According to the first embodiment, the processor 5 increases the irradiation frequency $F_I$ by increasing the emission frequency $F_L$ of the pulse laser light 33 from the laser device 3.

Accordingly, even when the pulse energy E of the pulse laser light 33 is not changed, the second energy parameter $P_2$ can be suppressed from decreasing.

(8) According to the first embodiment, the EUV light generation system 11a includes the target supply unit 26 that sequentially generates and supplies the plurality of droplets 27a as the target 27 to the optical path of the pulse laser light 33. The processor 5 increases the irradiation frequency $F_I$ by increasing both the generation frequency $F_D$ of the plurality of droplets 27a from the target supply unit 26 and the emission frequency $F_L$ of the pulse laser light 33 from the laser device 3.

Accordingly, even when the target 27 includes the plurality of droplets 27a, it is possible to suppress the second energy parameter $P_2$ from decreasing.

In other respects, the first embodiment is similar to the comparative example.

Figure 9:
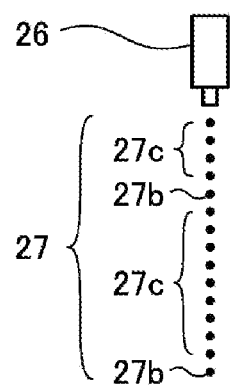
FIG. 9 shows an arrangement of droplets when the target supply unit sequentially generates and supplies a plurality of droplets as the target to the optical path of the pulse laser light in the second embodiment.
Figure 10:
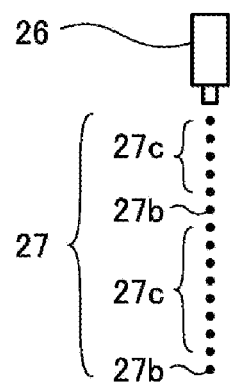
FIG. 10 shows an arrangement of droplets when the target supply unit sequentially generates and supplies a plurality of droplets as the target to the optical path of the pulse laser light in the second embodiment.

3. EUV Light Generation System 11a to Stepwise Increase Irradiation Frequency $F_I$ 3.1 Configuration and Operation FIGS. 9 and 10 show the arrangement of droplets 27b, 27c when the target supply unit 26 sequentially generates and supplies the plurality of droplets 27b, 27c as the target 27 to the optical path of the pulse laser light 33 in a second embodiment. The processing in the second embodiment is suitable for the case where the target supply unit 26 sequentially generates the droplets 27b, 27c. The configuration of the EUV light generation system 11a in the second embodiment is similar to that described with reference to FIG. 3.

The droplets 27b, 27c include the droplet 27c not to be irradiated with the pulse laser light 33 and the droplet 27b to be irradiated with the pulse laser light 33.

In FIGS. 9 and 10, one droplet 27b among the N droplets 27b, 27c generated in succession is irradiated with the pulse laser light 33. The ratio of the number of droplets 27b irradiated with the pulse laser light 33 to the number of droplets 27b, 27c is 1/N. N is an integer of 1 or larger, and preferably 5 or larger and 20 or smaller. In FIG. 9, N is 10, and in FIG. 10, N is 9.

The relationship between the generation frequency $F_D$ of the droplets 27b, 27c and the emission frequency $F_L$ of the pulse laser light 33 from the laser device 3 is set to $F_L = F_D/N$. The generation frequency $F_D$ is, for example, 100 kHz or higher and 200 kHz or lower, and the emission frequency $F_L$ is, for example, 10 kHz or higher and 20 kHz or lower. By changing the value of N from a large value to a small value, the ratio 1/N of the number of the droplets 27b irradiated with the pulse laser light 33 to the number of the droplets 27b, 27c can be increased.

When all pulses of the pulse laser light 33 are radiated to different droplets 27b, the emission frequency $F_L$ and the irradiation frequency $F_I$ are the same. By increasing the ratio 1/N without changing the generation frequency $F_D$, the irradiation frequency $F_I$ can be increased. The irradiation frequency $F_I$ varies stepwise in accordance with the value of N.

Figure 11:
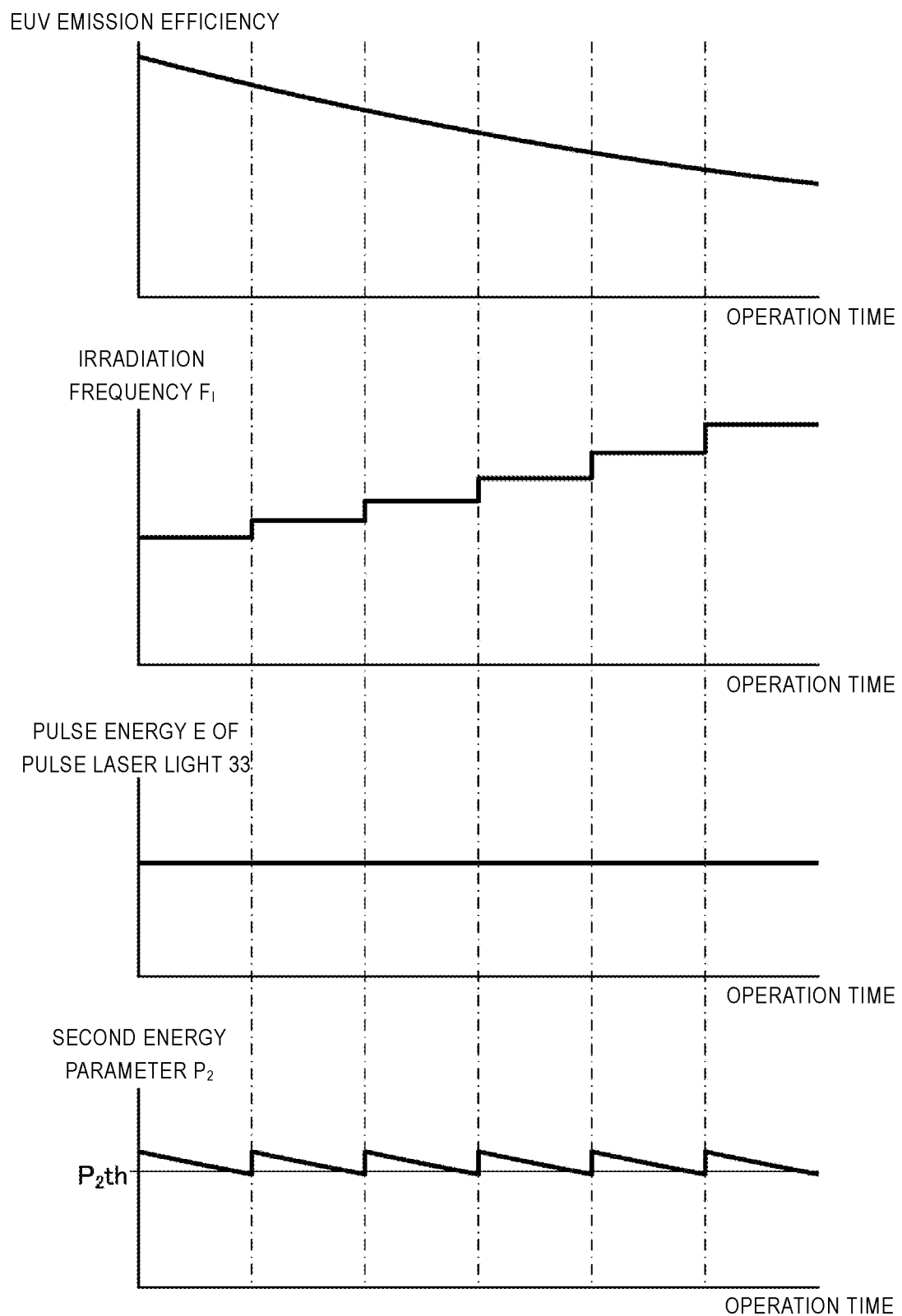
FIG. 11 is a graph showing decrease in the EUV emission efficiency in the second embodiment, control of the irradiation frequency and the pulse energy of the pulse laser light in accordance with the decrease, and change in the second energy parameter.

FIG. 11 is a graph showing decrease in the EUV emission efficiency in the second embodiment, control of the irradiation frequency $F_I$ and the pulse energy E of the pulse laser light 33 in accordance with the decrease, and change in the second energy parameter $P_2$.

In the second embodiment, the irradiation frequency $F_I$ is increased stepwise as the EUV emission efficiency decreases. That is, the irradiation frequency $F_I$ is increased at certain timing, and the irradiation frequency $F_I$ is maintained without being changed in a period other than the certain timing. The second energy parameter $P_2$ also increases at the timing at which the irradiation frequency $F_I$ is increased. During the period in which the irradiation frequency $F_I$ is maintained without being changed, the second energy parameter $P_2$ gradually decreases as the EUV emission efficiency decreases. Thus, the second energy parameter $P_2$ varies in a sawtooth waveform manner.

Figure 12:
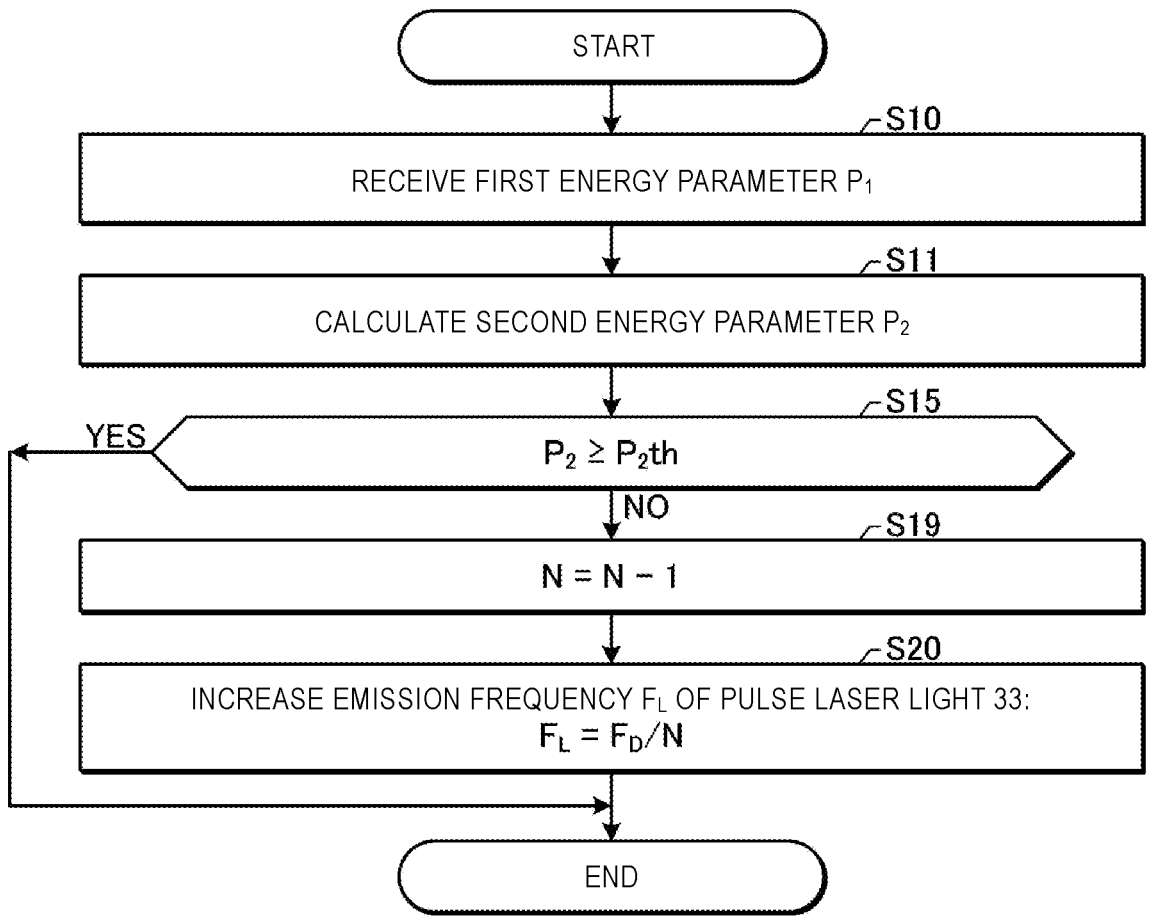
FIG. 12 is a flowchart showing an operation example for increasing the irradiation frequency stepwise in the second embodiment.

FIG. 12 is a flowchart showing an operation example for increasing the irradiation frequency $F_I$ stepwise in the second embodiment.

The processes of S10 and S11 in FIG. 12 are similar to those described with reference to FIG. 5.

After S11, in S15, the processor 5 determines whether the second energy parameter $P_2$ is equal to or larger than a threshold value $P_2$th. The threshold value $P_2$th is set to a value larger than the lower limit of the second energy parameter $P_2$ required by the EUV light utilization apparatus 6. When the second energy parameter $P_2$ is equal to or larger than the threshold value $P_2$th (S15: YES), the processor 5 ends the processing of the flowchart. When the second energy parameter $P_2$ is smaller than the threshold value $P_2$th (S15: NO), the processor 5 proceeds to S19.

In S19, the processor 5 subtracts 1 from the current value of N to update the value of N. For example, when the current value of N is $N_1$ and the new value of N is $N_2$, the value of N is updated so that $N_2 = N_1 - 1$ is satisfied. However, the present disclosure is not limited to the case of subtracting 1 each from the current value of N. An integer of 2 or larger may be subtracted.

In S20, the processor 5 increases the emission frequency $F_L$ of the pulse laser light 33 by the equation $F_L = F_D/N$. As a result, the irradiation frequency $F_I$ of the pulse laser light 33 with which the target 27 is irradiated can be increased.

After S20, the processor 5 ends the processing of the flowchart. The processing of the flowchart is repeated each time the operation time of the EUV light generation system 11a or the number of output pulses of the EUV light reaches a predetermined value.

In the second embodiment, the case where the irradiation frequency $F_I$ is increased when the second energy parameter $P_2$ is lower than the threshold value $P_2$th has been described, but the present disclosure is not limited thereto.

The irradiation frequency $F_I$ may be increased when the operation time of the EUV light generation system 11a reaches a predetermined value. Alternatively, the irradiation frequency $F_I$ may be increased when the number of output pulses of the EUV light reaches a predetermined value.

These predetermined values are set in advance based on the prediction of the EUV emission efficiency.

In this case, the second energy parameter $P_2$ may temporarily become lower than the second energy parameter $P_2$ shown in FIG. 11, but the second energy parameter $P_2$ may be recovered by increasing the irradiation frequency $F_I$ at the timing based on the operation time of the EUV light generation system 11a or the number of output pulses of the EUV light.

When the irradiation frequency $F_I$ is increased at the timing based on the operation time of the EUV light generation system 11a or the number of output pulses of the EUV light, the number to be subtracted from the current value of N may be determined based on the second energy parameter $P_2$. For example, in the case where the second energy parameter $P_2$ is significantly lower than the threshold value $P_2$th when the operation time of the EUV light generation system 11a reaches the predetermined value, the irradiation frequency $F_I$ may be significantly increased by subtracting an integer of 2 or larger from the current value of N.

3.2 Effect (9) According to the second embodiment, the target 27 includes the plurality of droplets 27b, 27c that are sequentially generated and supplied to the optical path of the pulse laser light 33. The plurality of droplets 27b, 27c include the droplet 27c not to be irradiated with the pulse laser light 33 and the droplet 27b to be irradiated with the pulse laser light 33. The processor 5 increases the irradiation frequency $F_I$ by increasing the ratio of the number of the droplets 27b irradiated with the pulse laser light 33 to the number of the plurality of droplets 27b, 27c.

Accordingly, it is possible to stepwise increase the irradiation frequency $F_I$ without changing the generation frequency $F_D$ of the droplets 27b, 27c.

(10) According to the second embodiment, the EUV light generation system 11a includes the target supply unit 26 that sequentially generates and supplies the plurality of droplets 27b, 27c as the target 27 to the optical path of the pulse laser light 33. The processor 5 controls the irradiation frequency $F_I$ by setting the relationship between the generation frequency $F_D$ of the plurality of droplets 27b, 27c from the target supply unit 26 and the emission frequency $F_L$ of the pulse laser light 33 from the laser device 3 to $F_L=F_D/N_1$. Thereafter, $F_L=F_D/N_2$ is set to increase the irradiation frequency $F_I$. $N_1$ is an integer of 2 or larger, and $N_2$ is an integer of 1 or larger and smaller than $N_1$.

Accordingly, it is possible to calculate the appropriate emission frequency $F_L$ based on the generation frequency $F_D$ of the droplets 27b, 27c.

(11) According to the second embodiment, the processor 5 increases the irradiation frequency $F_I$ when the second energy parameter $P_2$ is lower than the threshold value $P_2$th.

This suppresses the second energy parameter $P_2$ from being further decreased.

(12) According to the second embodiment, the processor 5 increases the irradiation frequency $F_I$ when the operation time of the EUV light generation system 11a reaches the predetermined value.

Accordingly, even when the second energy parameter $P_2$ is not monitored, it is possible to determine the timing of increasing the irradiation frequency $F_I$.

(13) According to the second embodiment, the processor 5 increases the irradiation frequency $F_I$ when the number of output pulses of the EUV light reaches the predetermined value.

Accordingly, even when the second energy parameter $P_2$ is not monitored, it is possible to determine the timing of increasing the irradiation frequency $F_I$. In other respects, the second embodiment is similar to the first embodiment.

4. EUV Light Generation System 11a for Changing Pulse Energy E of Pulse Laser Light 33

4.1 Configuration and Operation

Figure 13:
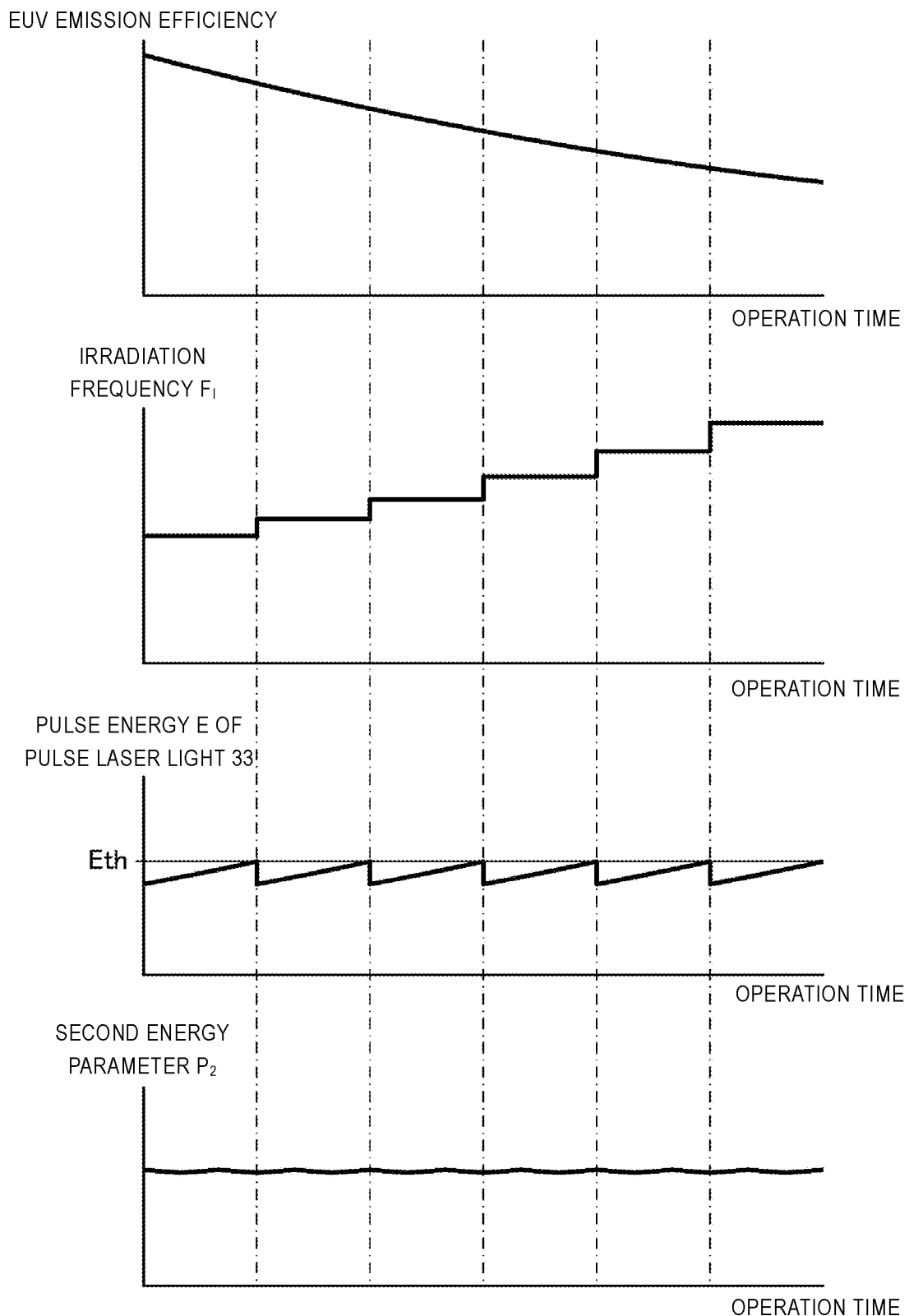
FIG. 13 is a graph showing decrease in the EUV emission efficiency in a third embodiment, control of the irradiation frequency and the pulse energy of the pulse laser light in accordance with the decrease, and change in the second energy parameter.

FIG. 13 is a graph showing decrease in the EUV emission efficiency in a third embodiment, control of the irradiation frequency $F_I$ and the pulse energy E of the pulse laser light 33 in accordance with the decrease, and change in the second energy parameter $P_2$. The processing in the third embodiment is suitable for the case where the target supply unit 26 sequentially generates the droplets 27b, 27c (see FIGS. 9 and 10). The configuration of the EUV light generation system 11a in the third embodiment is similar to that described with reference to FIG. 3.

In the third embodiment, the pulse energy E of the pulse laser light 33 is controlled so that the change in the second energy parameter $P_2$ is suppressed. That is, the pulse energy E of the pulse laser light 33 is increased as the EUV emission efficiency decreases.

It is desirable that the pulse energy E of the pulse laser light 33 does not exceed a threshold value Eth. In the third embodiment, when the target pulse energy Et of the pulse laser light 33 is higher than the threshold value Eth, the irradiation frequency $F_I$ is increased instead of increasing the pulse energy E of the pulse laser light 33.

When the irradiation frequency $F_I$ is increased, the pulse energy E of the pulse laser light 33 required to obtain the desired second energy parameter $P_2$ is decreased. Therefore, the pulse energy E of the pulse laser light 33 is decreased at the timing at which the irradiation frequency $F_I$ is increased.

Figure 14:
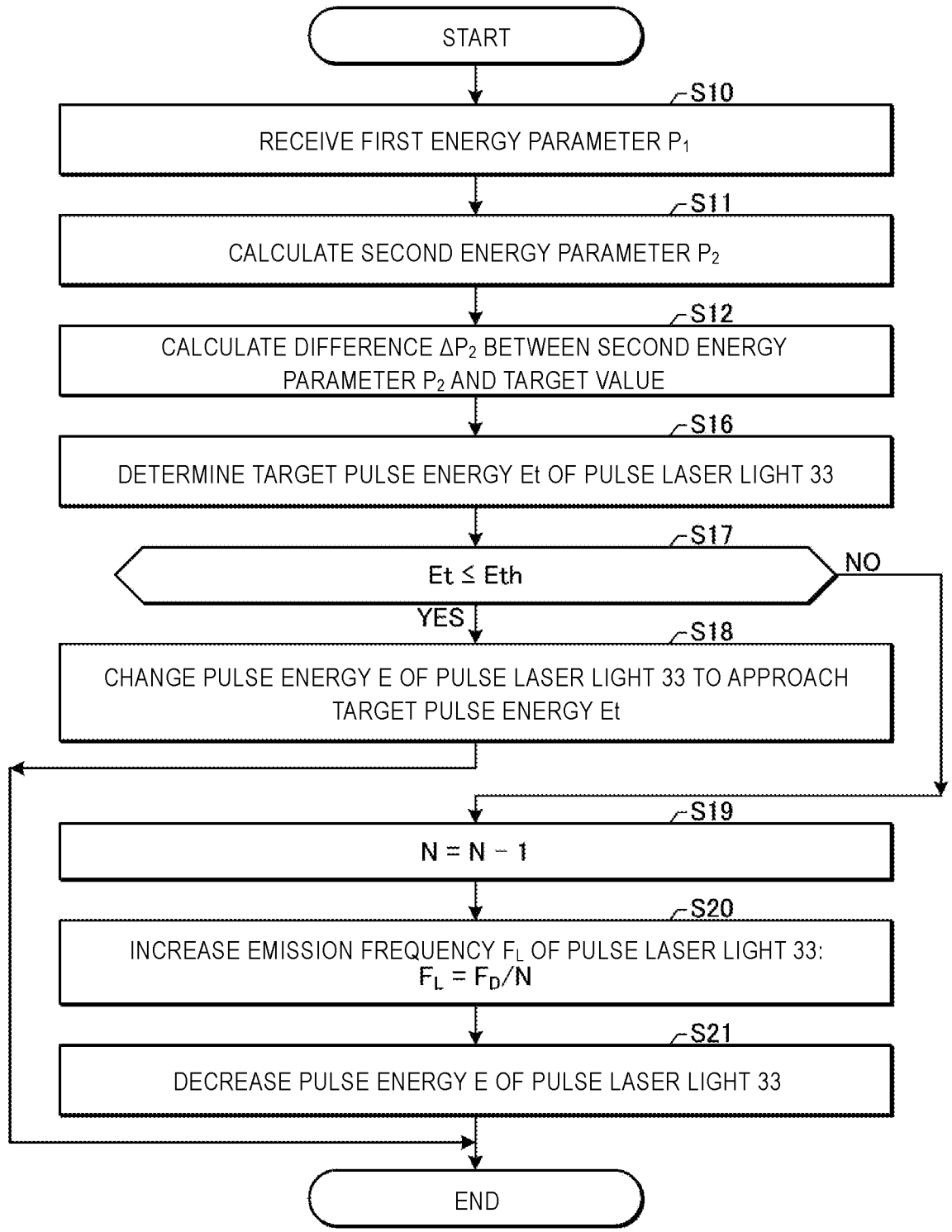
FIG. 14 is a flowchart showing an operation example for controlling the pulse energy and the irradiation frequency of the pulse laser light in the third embodiment.

FIG. 14 is a flowchart showing an operation example for controlling the pulse energy E and the irradiation frequency $F_I$ of the pulse laser light 33 in the third embodiment.

The processes of S10 to S12 in FIG. 14 are similar to those described with reference to FIG. 5.

After S12, in S16, the processor 5 determines the target pulse energy Et of the pulse laser light 33. For example, when the second energy parameter $P_2$ is lower than the target value, the target pulse energy Et of the pulse laser light 33 is increased in accordance with the difference $\Delta P_2$ from the target value.

In S17, the processor 5 determines whether or not the target pulse energy Et of the pulse laser light 33 determined in S16 is equal to or smaller than the threshold value Eth.

When the target pulse energy Et of the pulse laser light 33 is equal to or smaller than the threshold value Eth (S17: YES), the processor 5 proceeds to S18.

In S18, the processor 5 changes the pulse energy E of the pulse laser light 33 to approach the target pulse energy Et determined in S16. The pulse energy E may be controlled by PID control.

In the case that the target pulse energy Et of the pulse laser light 33 is increased in S16, the pulse energy E of the pulse laser light 33 is increased when the process of S18 is performed. By increasing the pulse energy E of the pulse laser light 33, the ratio of atoms excited by the pulse laser light 33 among atoms constituting the droplet 27b increases. Therefore, it is possible to suppress the second energy parameter $P_2$ from decreasing as the EUV emission efficiency decreases.

The processes of S16 to S18 correspond to the first processing of the present disclosure. After S18, the processor 5 ends the processing of the flowchart.

When the target pulse energy Et of the pulse laser light 33 is higher than the threshold value Eth (S17: NO), the processor 5 proceeds to S19 without changing the pulse energy E so as to approach the target pulse energy Et determined in S16.

The processes of S19 and S20 are similar to those described with reference to FIG. 12.

After S20, in S21, the processor 5 decreases the pulse energy E of the pulse laser light 33. Specifically, after the target pulse energy Et of the pulse laser light 33 is decreased, the pulse energy E is controlled so as to approach the target pulse energy Et. The pulse energy E of the pulse laser light 33 is controlled so as to suppress the change in the second energy parameter $P_2$ before and after the emission frequency $F_L$ of the pulse laser light 33 is increased in S20.

The processes of S19 to S21 correspond to the second processing of the present disclosure. After S21, the processor 5 ends the processing of the flowchart.

The processing of the flowchart is repeated each time the operation time of the EUV light generation system 11a or the number of output pulses of the EUV light reaches a predetermined value.

In the third embodiment, the case where the irradiation frequency $F_I$ is increased when the target pulse energy Et of the pulse laser light 33 is higher than the threshold value Eth has been described, but the present disclosure is not limited thereto.

The irradiation frequency $F_I$ may be increased when the operation time of the EUV light generation system 11a reaches a predetermined value. Alternatively, the irradiation frequency $F_I$ may be increased when the number of output pulses of the EUV light reaches a predetermined value. These predetermined values are set in advance based on the prediction of the EUV emission efficiency.

In this case, there is a possibility that the pulse energy E of the pulse laser light 33 temporarily becomes higher than the threshold value Eth. However, increase in the pulse energy E can be suppressed by increasing the irradiation frequency $F_I$ at the timing based on the operation time of the EUV light generation system 11a or the number of output pulses of the EUV light. Here, the threshold value Eth in this case is set to a value lower than a designed upper limit of the pulse energy E of the pulse laser light 33 in the EUV light generation system 11a.

4.2 Effect

(14) According to the third embodiment, the processor 5 performs the first processing (S16 to S18) of controlling the pulse energy E of the pulse laser light 33 so as to suppress the change in the second energy parameter $P_2$ and the second processing (S19 to S21) of increasing the irradiation frequency $F_I$ and decreasing the pulse energy E of the pulse laser light 33.

Accordingly, even when the irradiation frequency $F_I$ is increased stepwise, the pulse energy E of the pulse laser light 33 is adjusted to suppress the fluctuation in the second energy parameter $P_2$.

The dynamic range of the pulse energy E of the pulse laser light 33 may not be enough to compensate for the drop in the EUV emission efficiency, but in combination with the stepwise adjustment of the irradiation frequency $F_I$, decrease in the EUV emission efficiency can be compensated.

(15) According to the third embodiment, in the first processing (S16 to S18), the processor 5 increases the target pulse energy Et of the pulse laser light 33 when the second energy parameter $P_2$ is lower than the target value.

Accordingly, the fluctuation of the second energy parameter $P_2$ can be suppressed.

(16) According to the third embodiment, the processor 5 performs the second processing (S19 to S21) when the target pulse energy Et of the pulse laser light 33 is higher than the threshold value Eth Accordingly, it is possible to suppress the increase of the pulse energy E.

(17) According to the third embodiment, the target 27 includes the plurality of droplets 27b, 27c that are sequentially generated and supplied to the optical path of the pulse laser light 33. The plurality of droplets 27b, 27c include the droplet 27c not to be irradiated with the pulse laser light 33 and the droplet 27b to be irradiated with the pulse laser light 33. In the second processing (S19 to S21), the processor 5 increases the irradiation frequency $F_I$ by increasing the ratio of the number of the droplets 27b irradiated with the pulse laser light 33 to the number of the plurality of droplets 27b, 27c.

Accordingly, it is possible to stepwise increase the irradiation frequency $F_I$ without changing the generation frequency $F_D$ of the droplets 27b, 27c.

(18) According to the third embodiment, the EUV light generation system 11a includes the target supply unit 26 that sequentially generates and supplies the plurality of droplets 27b, 27c as the target 27 to the optical path of the pulse laser light 33. The processor 5 controls the irradiation frequency $F_I$ by setting the relationship between the generation frequency $F_D$ of the plurality of droplets 27b, 27c from the target supply unit 26 and the emission frequency $F_L$ of the pulse laser light 33 from the laser device 3 to $F_L=F_D/N_1$. Then, in the second processing (S19 to S21), $F_L=F_D/N_2$ is set to increase the irradiation frequency $F_I$. $N_1$ is an integer of 2 or larger, and $N_2$ is an integer of 1 or larger and smaller than $N_1$.

Accordingly, it is possible to calculate the appropriate emission frequency $F_L$ based on the generation frequency $F_D$ of the droplets 27b, 27c.

In other respects, the third embodiment is similar to the second embodiment.

5. Others

Figure 15:
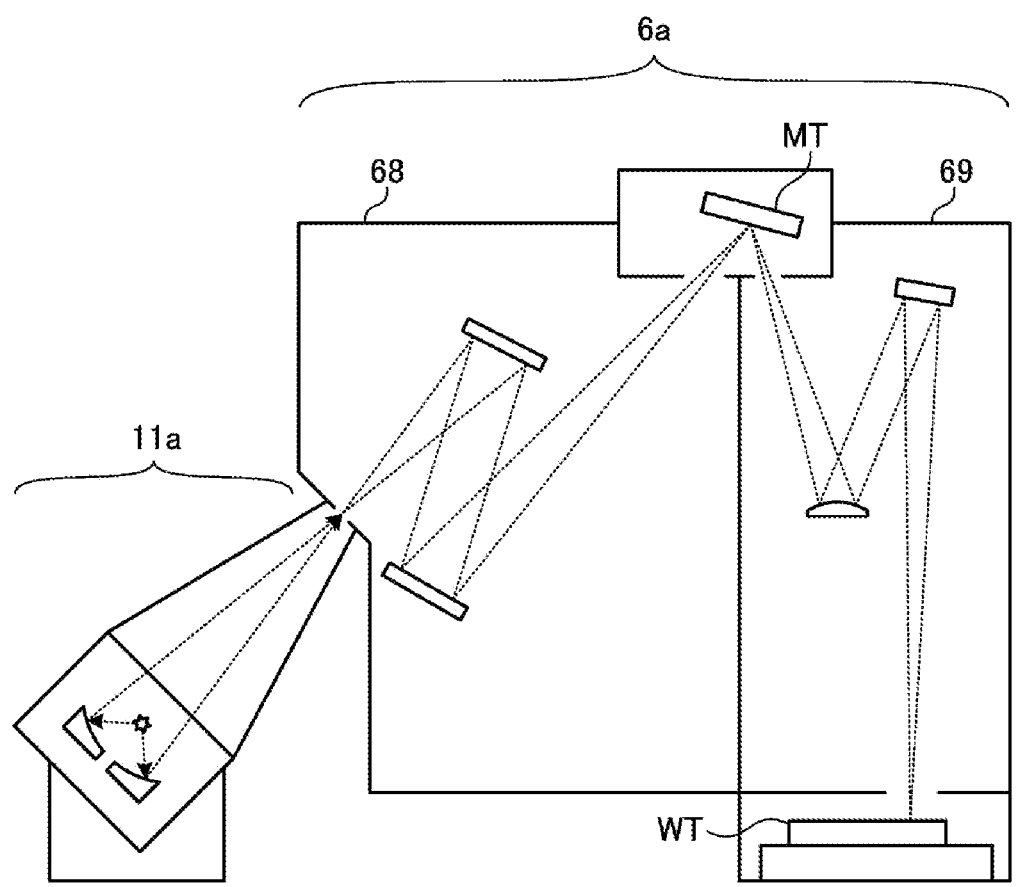
FIG. 15 schematically illustrates the configuration of an exposure apparatus connected to the EUV light generation system.

FIG. 15 schematically shows the configuration of an exposure apparatus 6a connected to the EUV light generation system 11a.

In FIG. 15, the exposure apparatus 6a as the EUV light utilization apparatus 6 (see FIG. 3) includes a mask irradiation unit 68 and a workpiece irradiation unit 69. The mask irradiation unit 68 illuminates, via a reflection optical system, a mask pattern of a mask table MT with the EUV light incident from the EUV light generation system 11a. The workpiece irradiation unit 69 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 16:
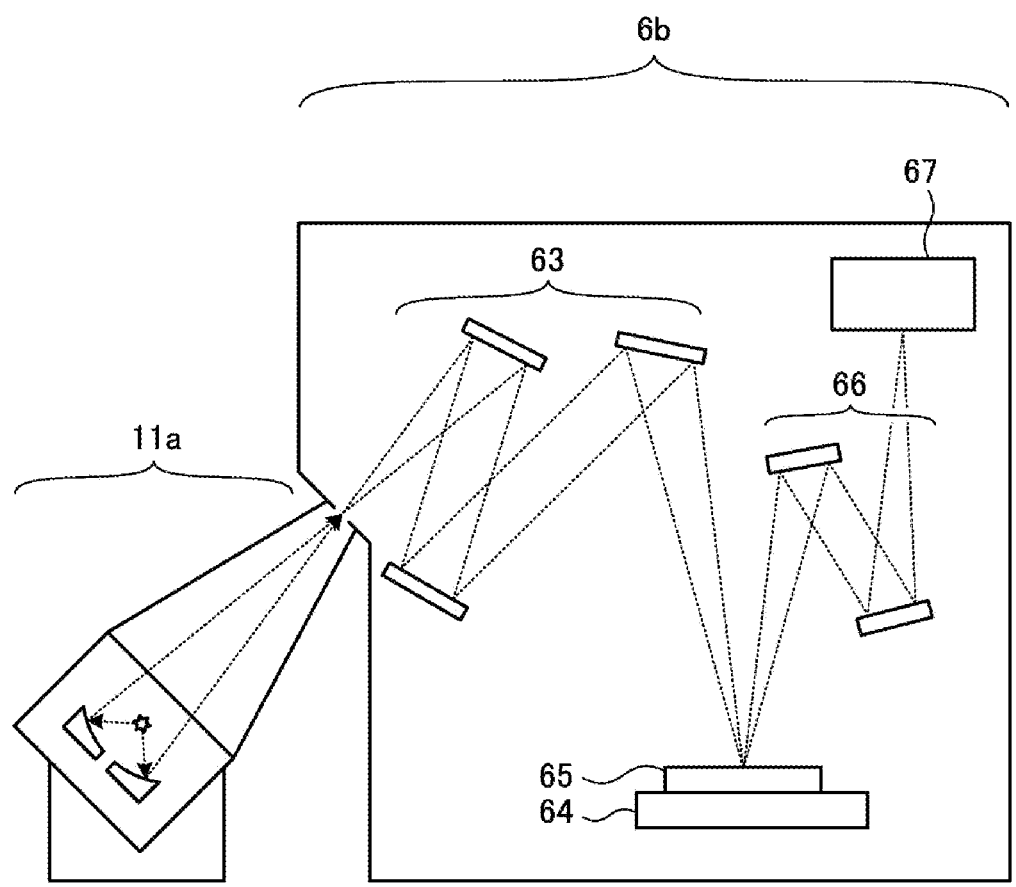
FIG. 16 schematically shows the configuration of an inspection apparatus connected to the EUV light generation system.

FIG. 16 schematically shows the configuration of an inspection apparatus 6b connected to the EUV light generation system 11a.

In FIG. 16, the inspection apparatus 6b as the EUV light utilization apparatus 6 (see FIG. 3) includes an illumination optical system 63 and a detection optical system 66. The illumination optical system 63 reflects the EUV light incident from the EUV light generation system 11a to illuminate a mask 65 placed on a mask stage 64. Here, the mask 65 conceptually includes a mask blank before a pattern is formed. The detection optical system 66 reflects the EUV light from the illuminated mask 65 and forms an image on a light receiving surface of a detector 67. The detector 67 having received the EUV light obtains an image of the mask 65. The detector 67 is, for example, a time delay integration (TDI) camera. Defects of the mask 65 are inspected based on the image of the mask 65 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation system, comprising:
   a laser device configured to emit pulse laser light;
   an EUV light concentrating mirror configured to reflect and concentrate extreme ultraviolet light generated by irradiating a target with the pulse laser light; and
   a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed,
   wherein the first energy parameter includes a combination of one of EUV pulse energy and EUV power and one of EUV light concentration size and EUV emission size, and the second energy parameter includes one of EUV power, EUV power density, and EUV radiation brightness.

2. The extreme ultraviolet light generation system according to claim 1,
   wherein the processor is connected to an EUV light utilization apparatus that receives the extreme ultraviolet light generated in the extreme ultraviolet light generation system and is configured to receive the first energy parameter from the EUV light utilization apparatus.

3. The extreme ultraviolet light generation system according to claim 1,
   wherein the processor calculates the second energy parameter based on the first energy parameter.

4. The extreme ultraviolet light generation system according to claim 1,
   wherein the processor receives the second energy parameter as the first energy parameter.

5. The extreme ultraviolet light generation system according to claim 1,
   wherein the processor increases the irradiation frequency by increasing an emission frequency of the pulse laser light from the laser device.

6. The extreme ultraviolet light generation system according to claim 1,
   further comprising a target supply unit configured to sequentially generate and supply a plurality of droplets as the target to an optical path of the pulse laser light,
   wherein the processor increases the irradiation frequency by increasing both a generation frequency of the plurality of droplets from the target supply unit and the emission frequency of the pulse laser light from the laser device.

7. The extreme ultraviolet light generation system according to claim 1,
   wherein the target includes a plurality of droplets that are sequentially generated and supplied to an optical path of the pulse laser light,
   the plurality of droplets includes a droplet not to be irradiated with the pulse laser light and a droplet to be irradiated with the pulse laser light, and
   the processor increases the irradiation frequency by increasing a ratio of the number of the droplets to be irradiated with the pulse laser light to the number of the plurality of droplets.

8. The extreme ultraviolet light generation system according to claim 1,
   further comprising a target supply unit configured to sequentially generate and supply a plurality of droplets as the target to an optical path of the pulse laser light,
   wherein the processor controls the irradiation frequency by setting relationship between a generation frequency $F_D$ of the plurality of droplets from the target supply unit and an emission frequency $F_L$ of the pulse laser light from the laser device to $F_L=F_D/N_1$, where $N_1$ is an integer of 2 or larger, and thereafter, increases the irradiation frequency by setting the relationship to $F_L=F_D/N_2$, where $N_2$ is an integer of 1 or larger and smaller than $N_1$.

9. The extreme ultraviolet light generation system according to claim 1,
   wherein the processor increases the irradiation frequency when the second energy parameter is lower than a threshold value.

10. The extreme ultraviolet light generation system according to claim 1,
    wherein the processor increases the irradiation frequency when operation time of the extreme ultraviolet light generation system reaches a predetermined value.

11. The extreme ultraviolet light generation system according to claim 1,
    wherein the processor increases the irradiation frequency when the number of output pulses of the extreme ultraviolet light reaches a predetermined value.

12. An extreme ultraviolet light generation system, comprising:
    a laser device configured to emit pulse laser light;
    an EUV light concentrating mirror configured to reflect and concentrate extreme ultraviolet light generated by irradiating a target with the pulse laser light; and
    a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed, wherein the processor performs first processing of controlling pulse energy of the pulse laser light so as to suppress change in the second energy parameter and second processing of increasing the irradiation frequency and decreasing the pulse energy of the pulse laser light.

13. The extreme ultraviolet light generation system according to claim 12, wherein, in the first processing, the processor increases target pulse energy of the pulse laser light when the second energy parameter is lower than a target value.

14. The extreme ultraviolet light generation system according to claim 12, wherein the processor performs the second processing when target pulse energy of the pulse laser light is higher than a threshold value.

15. The extreme ultraviolet light generation system according to claim 12, wherein the target includes a plurality of droplets that are sequentially generated and supplied to an optical path of the pulse laser light, the plurality of droplets includes a droplet not to be irradiated with the pulse laser light and a droplet to be irradiated with the pulse laser light, and in the second processing, the processor increases the irradiation frequency by increasing a ratio of the number of the droplets to be irradiated with the pulse laser light to the number of the plurality of droplets.

16. The extreme ultraviolet light generation system according to claim 12, further comprising a target supply unit configured to sequentially generate and supply a plurality of droplets as the target to an optical path of the pulse laser light, wherein the processor controls the irradiation frequency by setting relationship between a generation frequency $F_D$ of the plurality of droplets from the target supply unit and an emission frequency $F_L$ of the pulse laser light from the laser device to $F_L=F_D/N_1$, where $N_1$ is an integer of 2 or larger, and thereafter in the second processing, increases the irradiation frequency by setting the relationship to $F_L=F_D/N_2$, where $N_2$ is an integer of 1 or larger and smaller than $N_1$.

17. An electronic device manufacturing method, comprising:

generating extreme laser light in an extreme ultraviolet light generation system;

emitting the extreme ultraviolet light to an exposure apparatus; and exposing a photosensitive substrate to the extreme ultraviolet light in the exposure apparatus to manufacture an electronic device, the extreme ultraviolet light generation system including a laser device configured to emit pulse laser light, an EUV light concentrating mirror configured to reflect and concentrate the extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed, wherein the first energy parameter includes a combination of one of EUV pulse energy and EUV power and one of EUV light concentration size and EUV emission size, and the second energy parameter includes one of EUV power, EUV power density, and EUV radiation brightness.

18. A method of manufacturing an electronic device, comprising:

inspecting a defect of a mask by irradiating the mask with extreme ultraviolet light generated in an extreme ultraviolet light generation system;

selecting a mask using a result of the inspection; and exposing and transferring a pattern formed on the selected mask onto a photosensitive substrate, the extreme ultraviolet light generation system including a laser device configured to emit pulse laser light, an EUV light concentrating mirror configured to reflect and concentrate the extreme ultraviolet light generated by irradiating a target with the pulse laser light, and a processor configured to receive a first energy parameter of the extreme ultraviolet light and control an irradiation frequency of the pulse laser light with which the target is irradiated so that change in a second energy parameter related to energy per unit time of the extreme ultraviolet light reflected by the EUV light concentrating mirror is suppressed, wherein the first energy parameter includes a combination of one of EUV pulse energy and EUV power and one of EUV light concentration size and EUV emission size, and the second energy parameter includes one of EUV power, EUV power density, and EUV radiation brightness.

* * * * *